United States Patent
Hur et al.

(10) Patent No.: US 11,757,486 B2
(45) Date of Patent: *Sep. 12, 2023

(54) RECONFIGURABLE ELECTRICAL BALANCE DUPLEXER (EBD) SUPPORTING FREQUENCY DIVISION DUPLEX (FDD) AND TIME DIVISION DUPLEX (TDD)

(71) Applicant: Apple Inc., Cupertino, CA (US)

(72) Inventors: Joonhoi Hur, Sunnyvale, CA (US); Rastislav Vazny, Sunnyvale, CA (US); Ronald W. Dimpflmaier, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 45 days.

This patent is subject to a terminal disclaimer.

(21) Appl. No.: 16/927,748

(22) Filed: Jul. 13, 2020

(65) Prior Publication Data

US 2020/0343935 A1    Oct. 29, 2020

Related U.S. Application Data

(63) Continuation of application No. 16/145,857, filed on Sep. 28, 2018, now Pat. No. 10,715,204.

(51) Int. Cl.
| | | |
|---|---|---|
| *H04B 1/44* | (2006.01) | |
| *H04B 1/58* | (2006.01) | |
| *H04B 1/04* | (2006.01) | |
| *H03H 7/46* | (2006.01) | |
| *H04L 5/14* | (2006.01) | |
| *H04B 1/525* | (2015.01) | |

(52) U.S. Cl.
CPC ............. *H04B 1/582* (2013.01); *H03H 7/463* (2013.01); *H04B 1/0458* (2013.01); *H04B 1/44* (2013.01); *H04B 1/525* (2013.01); *H04L 5/14* (2013.01)

(58) Field of Classification Search
CPC ........ H04B 1/582; H04B 1/0458; H04B 1/44; H04B 1/525; H04B 1/0057; H04B 1/006; H03H 7/463; H03H 7/09; H03H 7/465; H04L 5/14
See application file for complete search history.

(56) References Cited

U.S. PATENT DOCUMENTS

| | | | | |
|---|---|---|---|---|
| 6,226,275 B1* | 5/2001 | Yang | ........................ | H04B 1/44 370/280 |
| 8,368,481 B2* | 2/2013 | Jin | .......................... | H03H 7/42 333/101 |

(Continued)

*Primary Examiner* — Edan Orgad
*Assistant Examiner* — Malick A Sohrab
(74) *Attorney, Agent, or Firm* — FLETCHER YODER PC

(57) ABSTRACT

Systems, methods, and devices for operating in either frequency division duplexing (FDD) or time division duplexing (TDD) for wireless communications using the same electrical balance duplexer (EBD) circuitry in a transceiver device are provided. A series of switches may selectively couple components of the EBD, such as a low noise amplifier (LNA), a power amplifier (PA), and balancing impedance, to ground based on selected operation mode (e.g., FDD or TDD) while reducing insertion loss of the receiver (RX) and transmitter (TX) signals. Tuned matching network blocks for the LNA and PA may be used in addition to the series of switches to provide impedance matching for additional reduction of insertion loss.

20 Claims, 7 Drawing Sheets

(56) References Cited

U.S. PATENT DOCUMENTS

| | | | |
|---|---|---|---|
| 8,792,836 B2* | 7/2014 | Mikhemar | H04B 1/582 |
| | | | 455/78 |
| 8,971,219 B2* | 3/2015 | Choksi | H03H 7/09 |
| | | | 370/282 |
| 9,548,715 B2 | 1/2017 | Van Liempd et al. | |
| 9,887,862 B2 | 2/2018 | Zhou et al. | |
| 2010/0118744 A1* | 5/2010 | Kwon | H04B 1/54 |
| | | | 370/278 |
| 2015/0085709 A1* | 3/2015 | Lee | H04L 5/14 |
| | | | 370/278 |
| 2019/0074862 A1* | 3/2019 | Wang | H04B 1/18 |
| 2019/0089396 A1* | 3/2019 | Kim | H04B 1/3805 |

\* cited by examiner

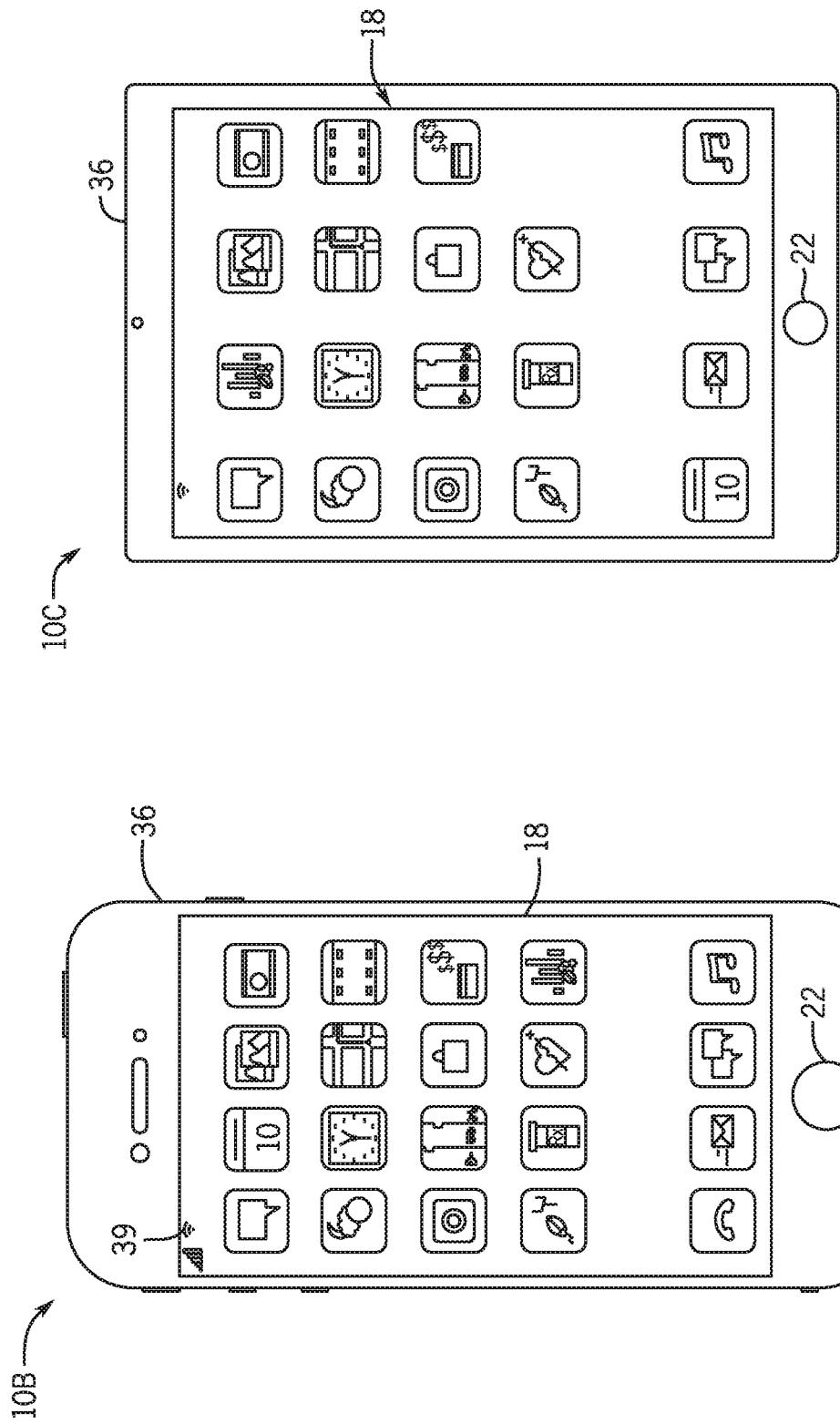

RECONFIGURABLE ELECTRICAL BALANCE DUPLEXER (EBD) SUPPORTING FREQUENCY DIVISION DUPLEX (FDD) AND TIME DIVISION DUPLEX (TDD)

CROSS-REFERENCE TO RELATED APPLICATIONS

This application is a continuation of and claims priority to U.S. application Ser. No. 16/145,857, filed Sep. 28, 2018, entitled, "Reconfigurable Electrical Balance Duplexer (EBD) Supporting Frequency Division Duplex (FDD) and Time Division Duplex (TDD)," the disclosure of which is incorporated by reference in its entirety for all purposes.

BACKGROUND

The present disclosure relates generally to techniques for facilitating radio frequency (RF) communications, and more particularly, to transceivers with an electrical balance duplexer.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Transmitters and receivers, or when coupled together as part of a single unit, transceivers, are commonly included in various electronic devices, and particularly, portable electronic devices such as, for example, phones (e.g., mobile and cellular phones, cordless phones, personal assistance devices), computers (e.g., laptops, tablet computers), internet connectivity routers (e.g., Wi-Fi routers or modems), radios, televisions, or any of various other stationary or handheld devices. Certain types of transceivers, such as full-duplex radio frequency (RF) transceivers, may generate and receive RF signals to be transmitted and/or received simultaneously by an antenna coupled to the transceiver, allowing for high speed data transmission. The RF transceiver is generally used to wirelessly communicate data over a network channel or other medium to and from one or more external wireless devices.

The receiver of the wireless device transceiver receives signals from a transmitter (e.g., of another device). The transmitter signals may be stronger and co-exist at a small frequency distance from the receiving frequency band. Thus, isolation between the transmitting and receiving paths may be desirable to prevent signal interference or distortion in transceivers. Bandpass filters and/or duplexers may be used to provide the necessary isolation.

Frequency selective filters, such as surface acoustic wave (SAW) filters may be used for wireless applications where a single antenna is shared between a transmitter and a receiver operating at close frequencies. SAW filters may be used for front-end filtering, narrow multiband filtering, and eliminating specific interference sources. They can be narrow or wide, with band-pass, low-pass, and high-pass finite-duration impulse response (FIR) characteristics. Additionally and/or alternatively, transceivers may utilize an electric balance duplexer (EBD), which may allow for bi-directional (e.g., duplex) communication over a single path and isolate the receiver from the transmitter while permitting them to share an antenna. The two modes of RF communication may include paired spectrum Frequency Division Duplex (FDD), which utilize two separate communication channels or frequency bands for the transmitter and receiver, and unpaired spectrum Time Division Duplex (TDD), which may use a single frequency band for both the transmitter and receiver by alternating time slots to transmit and receive signals.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments described herein are related to transceivers of wireless devices configured to transmit and receive signals simultaneously on different frequency bands of a wireless network (e.g., Frequency Division Duplexing (FDD)) or on the same frequency but at different times (e.g., Time Division Duplexing (TDD)). By way of example, an electrical balance duplexer in a transceiver may be configured to support both multi-standard FDD and TDD modes of wireless communications while removing insertion loss in TDD mode.

In one embodiment, a power amplifier duplexer (PAD) using an electrical balance duplexer (EBD) may be utilized to provide isolation between the transmitter and receiver paths. The usage of an electrical balance duplexer in the transceiver may generate signal isolation between transmitter and receiver paths, replacing multiple filters and switches that may be used to perform similar features, reducing hardware and their associated costs.

In another embodiment, a series of switches may be selectively configured to allow the transceiver to operate in either FDD or TDD mode. The switches may allow the electrical balance duplexer to be selectively reconfigured to support either communication mode, while still providing the necessary isolation to prevent further insertion (e.g., power signal) loss. In another embodiment, tunable matching network blocks with a series of switches may be implemented to facilitate impedance matching of components and independent tuning of the transceiver and receiver across frequency bands.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which:

FIG. 3 is a front view of a hand-held device representing another embodiment of the electronic device of FIG. 1;

FIG. 4 is a front view of a hand-held tablet device representing another embodiment of the electronic device of FIG. 1;

DETAILED DESCRIPTION OF SPECIFIC EMBODIMENTS

Figure 1:
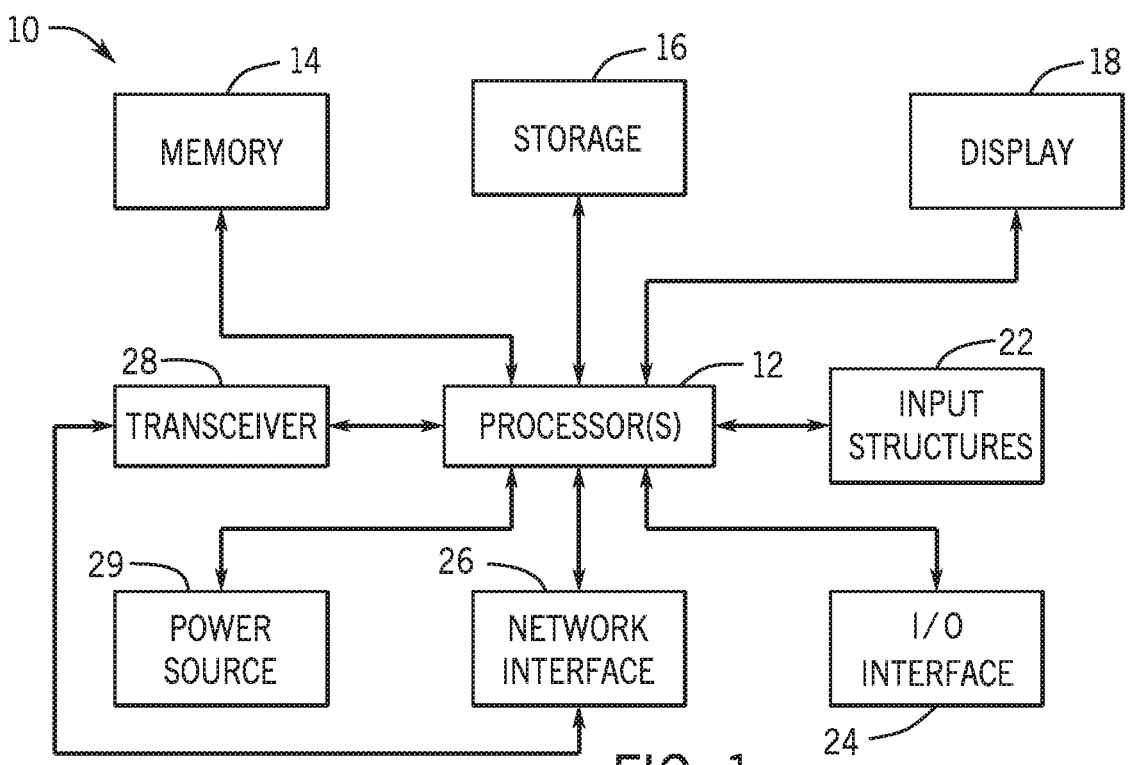
FIG. 1 is a schematic block diagram of an electronic device that may benefit from communicating in both TDD and FDD modes, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Radio communication systems use either time division duplexing (TDD) or frequency division duplexing (FDD) to enable the bi-directional communication in a transceiver, such that transmission and reception of signals are separated in either time or frequency. FDD utilizes one frequency band to transmit and one frequency band to receive. TDD transmits and receives data on the same frequency band but at alternating intervals. Wireless communication including Wi-Fi and Bluetooth typically use TDD while cellular communications, such as Long-Term Evolution (LTE), use FDD. In FDD radios, a transmitter and receiver in a radio frequency (RF) transceiver may operate simultaneously and may use the same antenna, which may result in self-interference (SI).

Since transmitter signals may be stronger than receiver signals, additional isolation between the transmitting and receiving paths in the transceiver may be desirable to prevent signal interference and distortion, especially when the receiver and transmitter are operating in the same or close frequency. As discussed herein, a power amplifier duplexer (PAD) using an electrical balance duplexer (EBD) may allow for effective isolation between transmitter and receiver signals when compared to other options.

Conventional architecture for isolation may utilize frequency filters, including a surface acoustic wave (SAW) fixed-frequency filter per each transmitter and receiver frequency band supported by wireless communication. Since each frequency band utilizes a separate filter, a wireless device may include various filters. The multiple filters may result in additional cost and packaging area, and thus, may lead to certain inefficiencies. Utilizing SAW filters may also result in insertion loss (e.g., loss of signal power), typically 3 dB for both the transmitter and receiver path. Electrical balance duplexers are an alternative to SAW filters in frequency division duplexing applications, achieving similar transmitter and receiver isolation and a lower insertion loss. In contrast to frequency based filters, such as SAW filters, an electrical balance duplexer may pass signals between the transmitter and antenna, and receiver and antenna, while simultaneously providing self-interference cancellation from the transmitter, at the same frequency. Additionally, a power amplifier duplexer may be used to support multiple modes of wireless communication, such as frequency division duplexing and time division duplexing, using different frequency bands or timing depending on the mode. A power amplifier may be selected to amplify an RF signal, such as an RF signal from a transmitter to the antenna and an RF signal from the antenna to the receiver, for a respective range of output power levels. The power amplifier duplexer may integrate the power amplifier and a duplexer, such as an electrical balance duplexer, into a single package, reducing hardware and associated costs.

However, only limited isolation may be achieved using the electrical balance duplexer and may result in additional insertion loss. Techniques used to achieve a higher isolation may result in higher insertion loss (e.g., loss of signal power or amount of signal removed from signal path due to a circuit element), such that isolation may be achieved at the expense of insertion loss. To achieve high data rate transmissions, such as those used for cellular signals, the electrical balance duplexer may need sufficient broadband isolation and reduction in insertion loss of signals, which may be achieved when its balancing network impedance equals the antenna impedance over a desired frequency band.

To reduce insertion loss, as discussed above, embodiments presented herein describe a power amplifier duplexer with a reconfigurable electrical balancer duplexer to operate in either a TDD or FDD mode, while minimizing insertion. Additionally, depending on the frequency band used to transmit or receive, tunable matching network blocks for the receiver and transmitter may be implemented in the reconfigurable electrical balance duplexer for matching component impedances for minimizing insertion loss, and tuning the transmission and reception across frequency bands.

With the foregoing in mind, a general description of suitable electronic device that may communicate via the reconfigurable electrical balance duplexer for either FDD or TDD mode will be provided below. Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, a network interface 26, a transceiver 28, and a power source 29. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
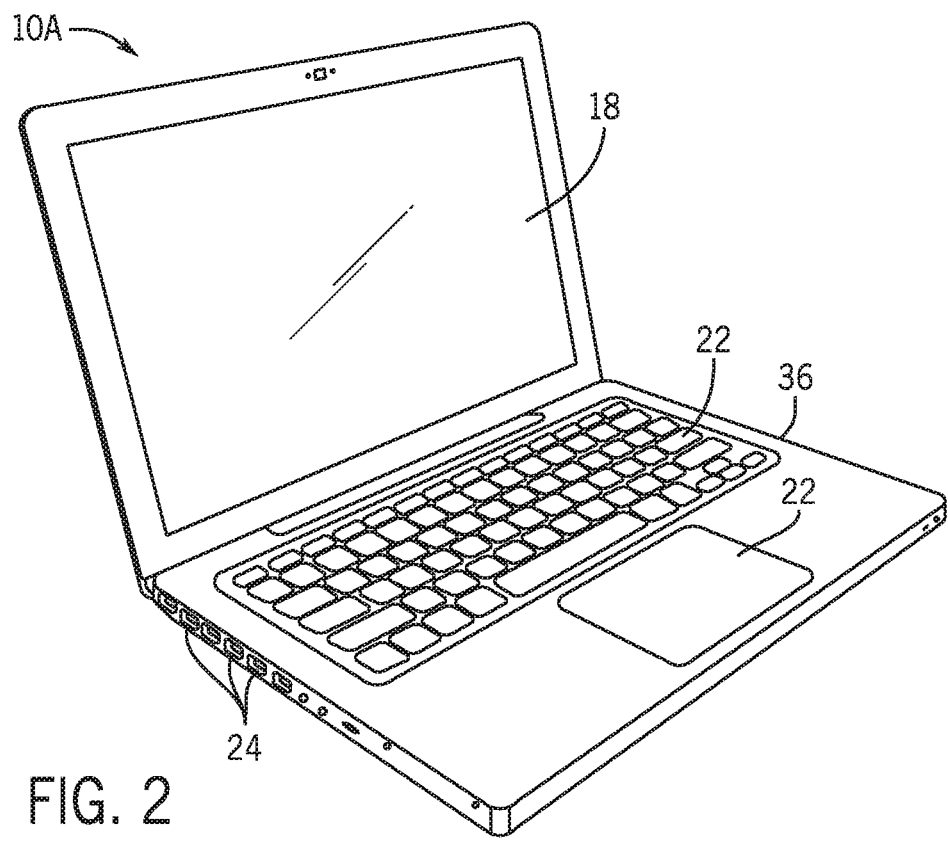
FIG. 2 is a perspective view of a notebook computer representing an embodiment of the electronic device of FIG. 1.
Figure 5:
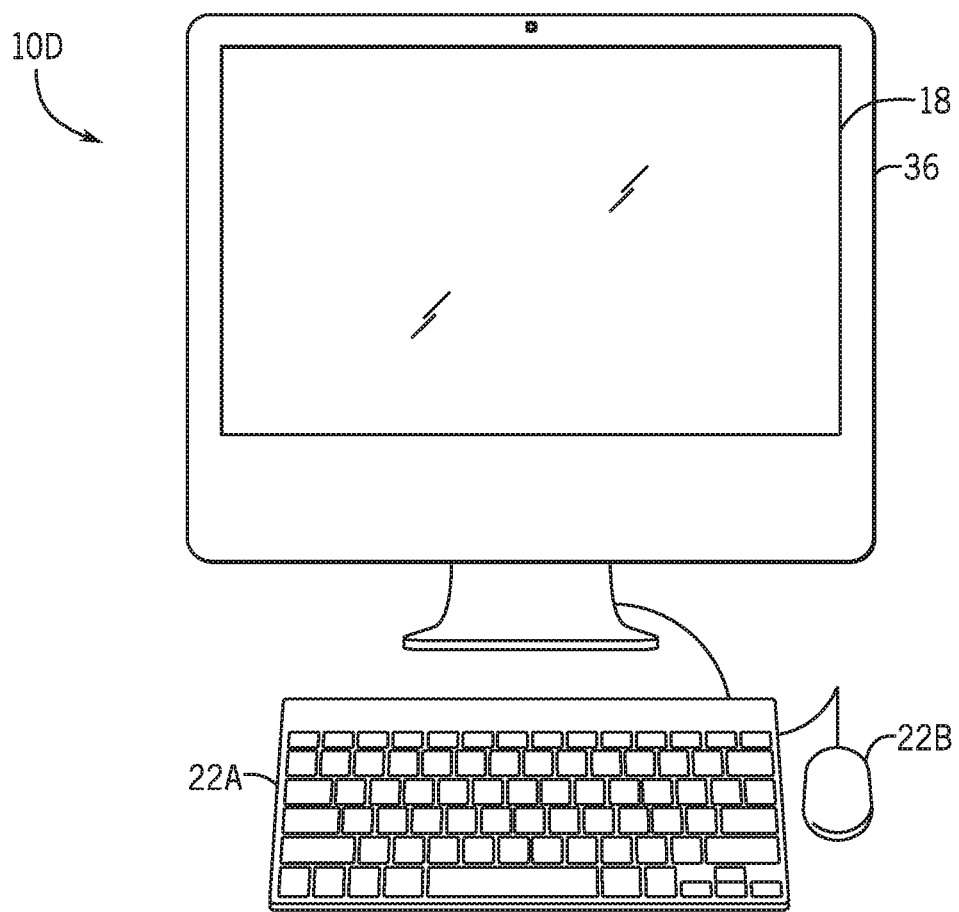
FIG. 5 is a front view of a desktop computer representing another embodiment of the electronic device of FIG. 1.
Figure 6:
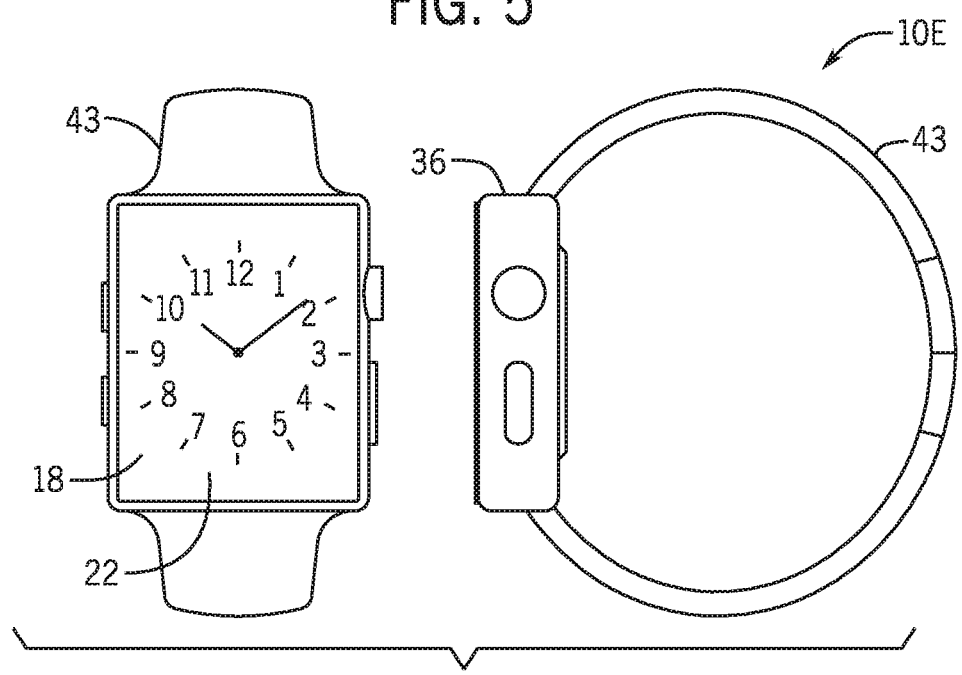
FIG. 6 is a front view and side view of a wearable electronic device representing another embodiment of the electronic device of FIG. 1.

By way of example, the electronic device 10 may represent a block diagram of the notebook computer depicted in FIG. 2, the handheld mobile device depicted in FIG. 3, the handheld tablet device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 may be operably coupled with the memory 14 and the nonvolatile storage 16 to facilitate the use of the processors(s) 12 to implement various stored algorithms. As discussed herein, the algorithms may include algorithms to control switch configurations to operate in different standard (e.g., FDD or TDD) modes. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26.

The network interface 26 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a 3rd generation (3G) cellular network, 4th generation (4G) cellular network, long term evolution (LTE) cellular network, long term evolution license assisted access (LTE-LAA) cellular network. The network interface 26 may also include one or more interfaces for, for example, broadband fixed wireless access networks (WiMAX), mobile broadband Wireless networks (mobile WiMAX), and so forth.

In certain embodiments, to allow the electronic device 10 to communicate over the aforementioned wireless networks (e.g., Wi-Fi, WiMAX, mobile WiMAX, 4G, LTE, and so forth), the electronic device 10 may include a transceiver 28. The transceiver 28 may include circuitry the may be useful in both wirelessly receiving and/or wirelessly transmitting signals (e.g., data signals). Indeed, in some embodiments, as will be further appreciated, the transceiver 28 may include a transmitter and a receiver combined into a single unit. For example, the transceiver 28 may transmit and receive orthogonal frequency division multiplexing (OFDM) signals (e.g., OFDM data symbols) to support data communication in wireless applications such as, for example, Personal Area Network (PAN) networks (e.g., Bluetooth), Wireless Local Area Network (WLAN) networks (e.g., 802.11x Wi-Fi), Wide Area Network (WAN) networks (e.g., 3G, 4G, and LTE and LTE-LAA cellular networks), Worldwide Interoperability for Microwave Access (WiMAX) networks, mobile WiMAX networks, and so forth. The transceiver 28 may also include mode selection circuitry, which enables dynamic selection between various modes of operation. For example, the transceiver 28 may be set (e.g., by the processor 12) to operate in TDD mode or FDD mode. In some embodiments, the processor 12 may request the mode of operation based upon detecting an indication requesting a particular mode of operation from either the user input structures 22 or based upon certain network operating conditions.

As further illustrated, the electronic device 10 may include a power source 29. The power source 29 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 10A, is illustrated in FIG. 2. The depicted computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a GUI or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include an enclosure 36 to protect interior components from physical damage and to shield them from electromagnetic interference. The enclosure 36 may surround the display 18. The I/O interfaces 24 may open through the enclosure 36 and may include, for example, an I/O port for a hardwired connection for charging and/or content manipulation using a standard connector and protocol, such as the Lightning connector provided by Apple Inc., a universal service bus (USB), or other similar connector and protocol.

User input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of a handheld tablet device 10C, which represents another embodiment of the electronic device 10. The handheld tablet device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif. The handheld device 10C may also include an enclosure 36 that holds the electronic display 18. Input structures 22 may include, for example, a hardware or virtual home button.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. It should be noted that the computer 10D may also represent a personal computer (PC) by another manufacturer. A similar enclosure 36 may be provided to protect and enclose internal components of the computer 10D such as the display 18. In certain embodiments, a user of the computer 10D may interact with the computer 10D using various peripheral input devices, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 43, may be an Apple Watch® by Apple Inc. More generally, the wearable electronic device 10E may be any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., liquid crystal display (LCD), organic light emitting diode (OLED) display, active-matrix organic light emitting diode (AMOLED) display, and so forth), as well as input structures 22, which may allow users to interact with a user interface of the wearable electronic device 10E.

In certain embodiments, as previously noted above, each embodiment (e.g., notebook computer 10A, handheld device 10B, handheld tablet device 10C, computer 10D, and wearable electronic device 10E) of the electronic device 10 may include a transceiver 28, which may include an in-phase/quadrature (I/Q) transceiver (e.g., WLAN I/Q transceiver). Indeed, as will be further appreciated, the I/Q transceiver may include a transmitter path and receiver path, and may be used to reduce or substantially eliminate IQMM and/or LO leakage components that may otherwise become apparent in a radio frequency transmission signal of the transceiver.

Electronic devices 10A, 10B, 10C, 10D, and 10E described above may all utilize transceivers with power amplifier duplexer utilizing a reconfigurable electrical balance duplexer to operate in either an FDD or TDD mode, and tunable impedance matching network blocks for additional isolation and/or reduced insertion loss for the transmitter and receiver.

As discussed herein, in certain implementations, the different modes may be set algorithmically based on factors such as a compatibility to communicate with other devices in a wireless communication system, such as the communication standard (e.g., FDD or TDD) used by the other devices. For example, operation mode may be determined after detecting communication standard of other devices in the wireless communication system or as pre-configured by a user, and subsequently, algorithms may send control signals to reconfigure the electrical balance duplexer depending on the given operation mode.

Figure 7A:
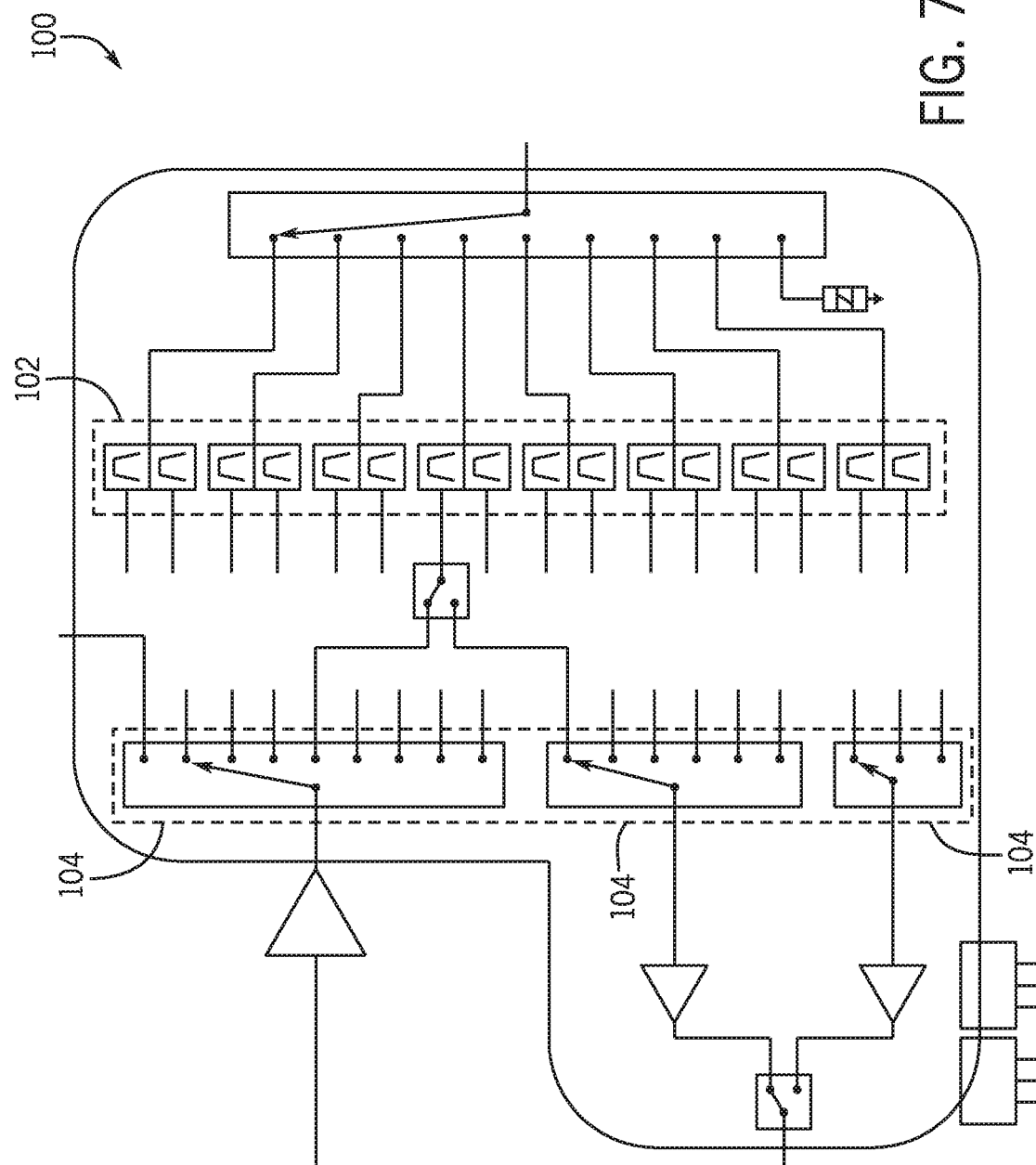
FIG. 7A is a schematic diagram of a power amplifier duplexer using filters and switches for isolation of the transmitter and receiver, which may be used in the electronic device of FIG. 1, in accordance with an embodiment.

As previously mentioned, wireless RF devices used for cellular communication may use FDD to operate on two frequencies, providing simultaneous transmission on one frequency band and reception on another frequency band. A duplexer may isolate the sensitive receiver circuit from the high power transmitter circuit. As shown by the schematic diagram of a power amplifier duplexer 100 in FIG. 7A, some duplexers may rely on a series of frequency-selective filters 102, such as surface acoustic wave or thin film bulk acoustic resonator filters. A filter 102 may be placed in the transmitter path to attenuate (e.g., isolate) the transmitter noise when passing signals in a receiver frequency band while another filter 102 may be placed in the receiver path to prevent the transmitter signal from over leaking and overloading the receiver. Thus, the transmitter path and receiver path may each use frequency filters 102 to provide isolation while communicating with the antenna.

While the filters 102 may have a low insertion loss, they support one frequency band and may result in multiple duplexers or filters 102 for multi-band operation. Duplexers may be connected to the RF device antenna through antenna switches 104, and thus, a series of switches 104 may be used in addition to multiple filters 102 to provide proper isolation of the transmitter and receiver. As expected, integrating multiple switches 104 and filters 102 may result in a bulky and/or costly receiver microcircuit. Using an electrical balance duplexer instead may provide isolation and remove frequency dependent filters 102.

Figure 7B:
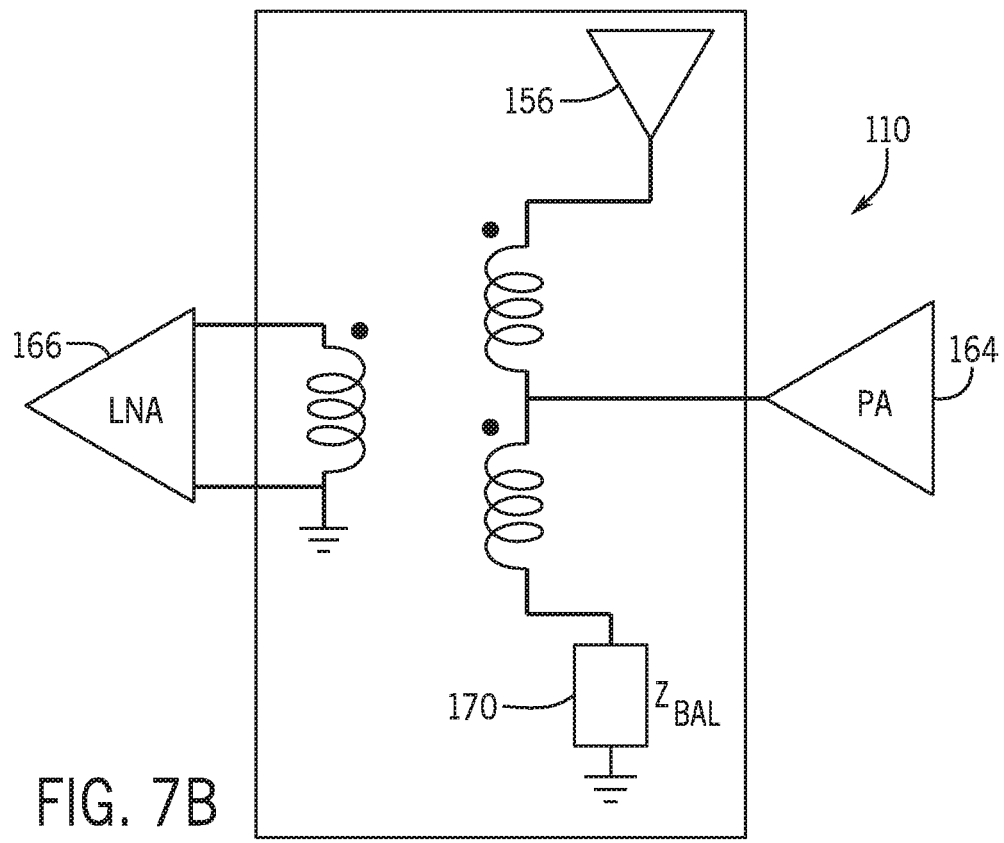
FIG. 7B is a schematic diagram of a power amplifier duplexer using an electrical balance duplexer for isolation of the transmitter and receiver, which may be used in the electronic device of FIG. 1, in accordance with an embodiment.

To further illustrate an electrical balance duplexer that may be integrated with a power amplifier (e.g., power amplifier duplexer) of an electronic device 10, schematic diagram 110 in FIG. 7B illustrates an electrical balance duplexer. Generally, an electrical balancer duplexer uses electrical balancing in hybrid junctions in order to isolate the transmitter and receiver, which may use the same antenna while communicating simultaneously over different frequency bands in an operation mode.

As shown, a power amplifier (PA) 164, a low noise amplifier (LNA) 166, an antenna 156, and balancing impedance 170, may each be connected to different terminals of a four port hybrid junction. The transmitter and receiver isolation may be achieved when the balancing impedance 170 and antenna impedance are the same. However, wireless electronic devices 10 utilizing an electrical balance duplexer may be mobile, and thus, environmental factors may change with mobility. The varying environmental factors may result in varied antenna impedance, and as a result, the balancing impedance may need to be controlled and varied to match the antenna impedance to provide optimum isolation.

Figure 8:
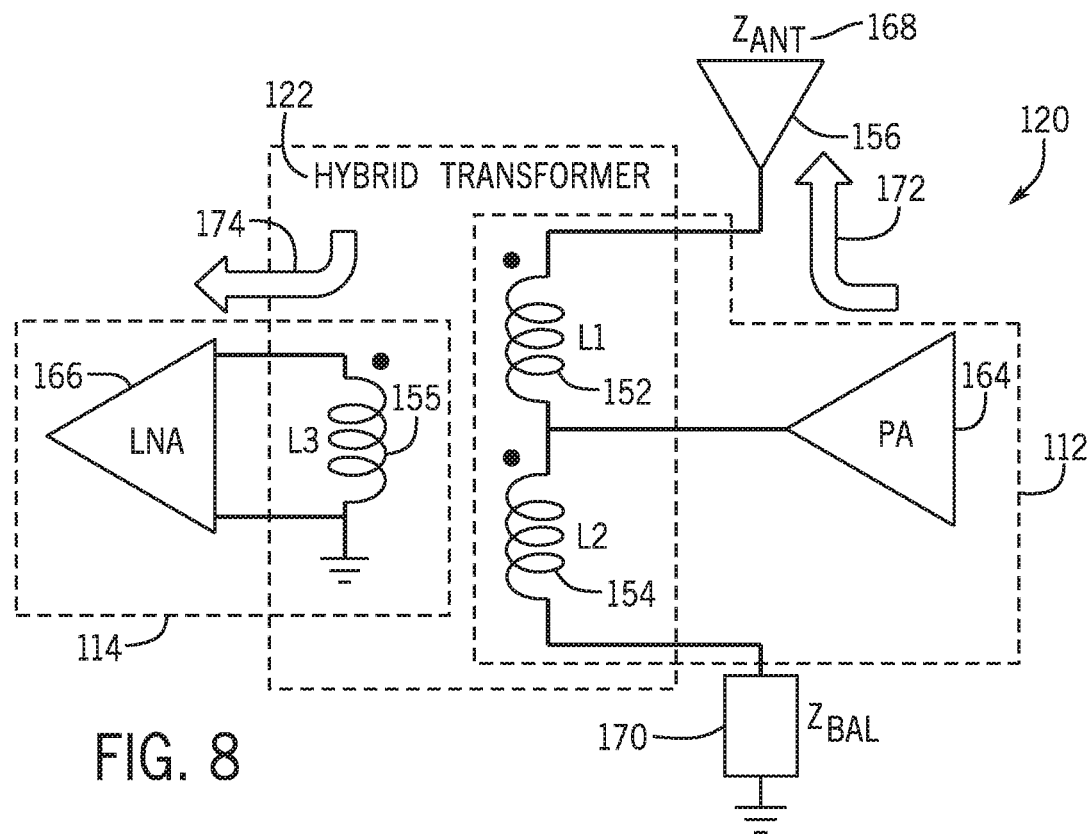
FIG. 8 is a schematic diagram of an electrical balance duplexer that may be used in the electronic device of FIG. 1, in accordance with an embodiment.

To further detail the circuit of an electrical balance duplexer that may be used in the transceiver, schematic diagram 120 of FIG. 8 depicts the electrical balance duplexer of FIG. 7B and its circuit components. As shown, the electrical balance duplexer circuit may be implemented with a hybrid transformer 122, formed by a first inductor (L1) 152 and second inductor (L2) 154, coupled to an antenna 156. This portion of the hybrid transformer 122 may make up a transmitter port 112. A third inductor (L3) 155 may be magnetically coupled to the first and second inductors 152, 154 of the hybrid transformer 122, and this portion of the hybrid transformer 122 may make up a receiver port 114. As indicated by arrow 172, the transmitter path may utilize a power amplifier (PA) 164 to amplify signals at the antenna 156 when transmitting. Similarly, as indicated by arrow 174, the receiver path may utilize a low noise amplifier (LNA) 166 to amplify the power of signals received at the antenna 156. The power amplifier 164 is used in transmitting a signal while the low noise amplifier 166 is used in receiving a signal. The hybrid transformer may connect the transmitter and receiver to the antenna while maintaining a level of isolation between the power amplifier 164 and low noise amplifier 166.

The hybrid transformer may isolate the transmitter and receiver ports, match impedance at each port, as well as divide the transmitter and receiver power in different portions. Isolation between the ports may be achieved when balancing impedance 170 ($Z_{BAL}$) is equal to or close to antenna impedance 168 ($Z_{ANT}$), such that that signal transmission is optimized. Thus, by controlling the balancing impedance 170 to be the same or similar to the antenna impedance 168, higher transmitter path and receiver path isolation may be obtained. However, determining exact impedance at the antenna may depend on the entire composition of the coupling structure. The potential antenna impedance may also vary due to electromagnetic environments or wireless device interactions operating in either TDD or FDD mode, and thus, the antenna impedance 168 may be difficult to determine. Instead, a series of switches may be used to provide isolation at the transceiver port and receiver port while using the same circuitry to operate in either TDD or FDD mode, allowing for lower insertion loss.

Figures 9, 10:
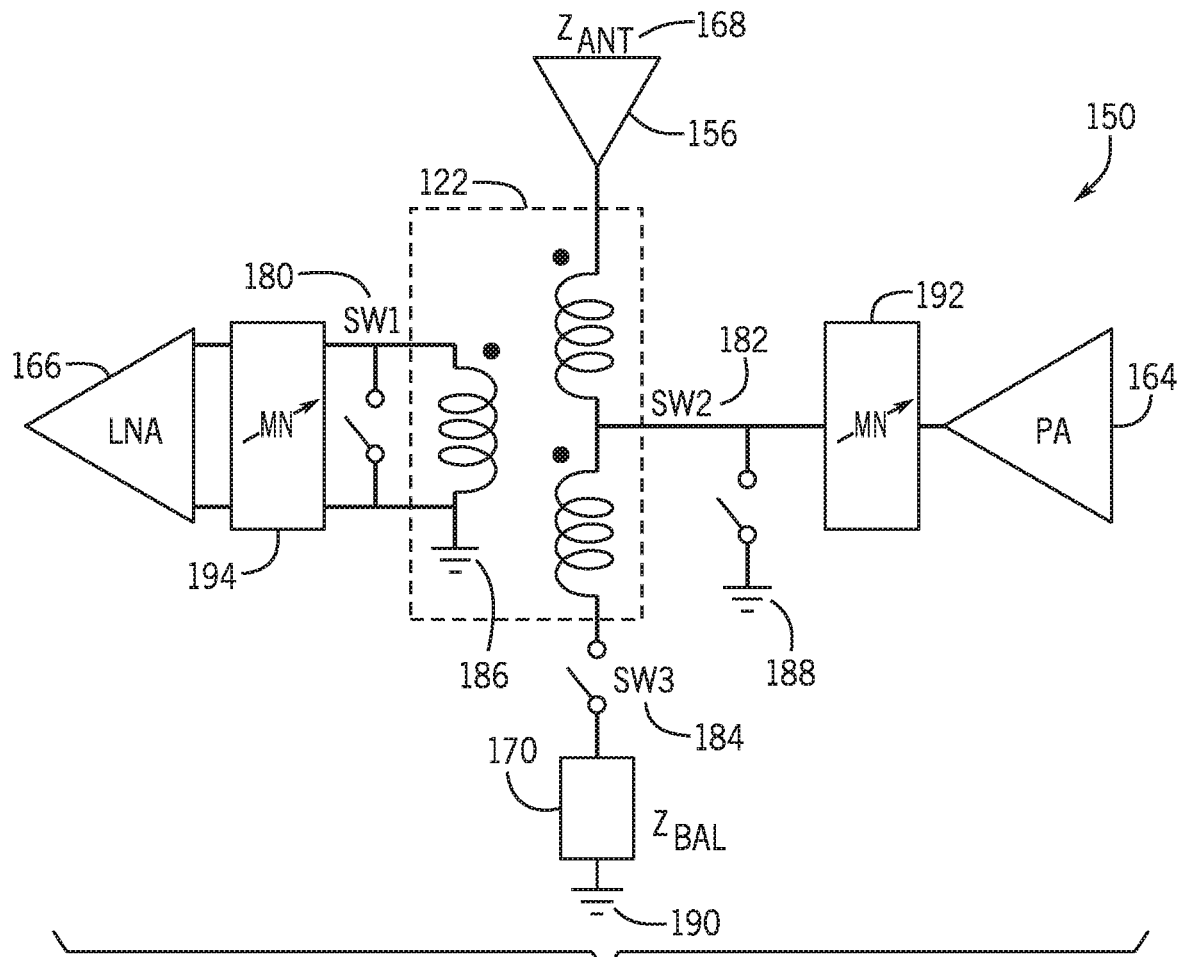
FIG. 9 is a schematic diagram of a reconfigurable electrical balance duplexer that may operate in either FDD or TDD mode, in accordance with an embodiment.
FIG. 10 is a table diagram of switch configurations to reconfigure the reconfigurable electrical balance duplexer of FIG. 9 to operate in either FDD or TDD mode, in accordance with an embodiment.

To illustrate, block diagram in FIG. 9 depicts a reconfigurable electrical balance duplexer 150 with switches used to support both TDD and FDD with minimal insertion loss. As shown, a first switch 180 (SW1), a second switch 182 (SW2), and a third switch 184 (SW3), may be connected to components used for the transmitter path and/or reception paths, as previously discussed. The switches may selectively couple certain components to ground 186, 188, 190. For example, specific components (e.g., LNA 166 or PA 164) of the electrical balance duplexer 150 circuitry may be used to operate in either TDD or FDD mode while two concurrent signal paths are isolated by connecting particular components to ground. To operate in FDD mode, the switches may be set to operate the electrical balance duplexer 150 in a similar manner to the electrical balance duplexer architecture discussed in FIG. 7B. Accordingly, as illustrated in the table 200 of FIG. 10, to operate in FDD mode, the first switch 180, which is disposed between a receiver side of the hybrid transformer 122 and the low noise amplifier 166, and the second switch 182, which is disposed between a transmitter side of the hybrid transformer 122 and the power amplifier 164, may be opened (e.g., off) and the third switch 184, which is disposed between the hybrid transformer 122 and the balancing impedance 170 may be closed (e.g., on). This FDD mode configuration of switches may allow the reconfigurable electrical balance duplexer 150 to concurrently use the low noise amplifier 166 for amplifying signals received from the antenna 156 on one a frequency band and transmitting signals to the antenna 156 on a different frequency band.

The reconfigurable electrical balance duplexer 150 switches 180, 182, 184 may be configured to operate in TDD mode, such that a single frequency band is used to transmit and receive during different time slots. Accordingly, as illustrated in table 200 of FIG. 10, two TDD modes exist, one mode for transmission (TX) and another mode for reception (RX). The third switch 184 may be turned off during both the TDD transmit (TX) and TDD reception (RX) modes. Since TDD mode alternates the transmission and reception of data signals over time, the balancing impedance 170 may be an unused component since isolation and insertion loss may be controlled by selectively coupling transmission and reception paths to the antenna 156 using the first switch 180 and second switch 182 based on operation mode. Thus, to operate in TDD TX mode time slot, which may utilize the power amplifier 164 to amplify signals to be transmitted at the antenna 156, the first switch 180 may be closed (e.g., on), coupling the LNA 166 to ground 186, while the second switch 182 and the third switch 184 may be opened (e.g., off), resulting in a coupling of the PA 164 to the antenna as opposed to the ground 188 and/or the balancing impedance 170. In this manner, the path of the low noise amplifier 166 used for signal reception may be disconnected from the antenna 156, which may eliminate transmission signal loss that may occur in the electrical balance duplexer 150 since that path would otherwise be available.

Similarly, to operate in the TDD RX mode, which may utilize the low noise amplifier 166 to amplify signals received at the antenna 156, the first switch 180 may be opened (e.g., off) while the second switch 182 may be closed (e.g., on) and the third switch 184 may be opened (e.g., off). In this manner, the path of the power amplifier 164 used for signal transmission may be effectively disconnected from the antenna, which may eliminate received signal loss that may occur in the electrical balance duplexer 150 since the path would otherwise be available. As previously mentioned, most transceivers utilizing other isolation techniques, such as SAW filters, result in an insertion loss of 3 dB for both the transmission and reception of signals. The current technique, which uses dynamically reconfigurable switches, may reduce the insertion loss to 0.5 dB in TDD mode. In addition to providing TDD and FDD operation using the same circuitry while isolating the transmitter and receiver to minimize insertion loss using switches that selectively couple circuit paths to ground, matching tuning network blocks may further optimize communication in FDD and TDD modes.

As shown, tunable matching network blocks 192, 194 may be implemented in addition to the switches of the reconfigurable electrical balance duplexer 150. Tunable matching network blocks 192, 194 may be implemented in the circuit to further optimize performance in either TDD or FDD mode using the configurations previously described. Impedance matching may be used to match the impedance between components of the electrical balance duplexer 150 circuitry, such as the source (e.g., PA 164) to the load (e.g., antenna impedance 168), allowing for the maximum amount of power transferred from the source to the load for a signal. As previously mentioned, the antenna impedance 168 may vary with electromagnetic environment conditions. Thus, matching network blocks 192, 194 may be tuned to the varying target impedance based on the antenna impedance 168. The source impedance for the low noise amplifier 166 may also be matched to the load impedance for the power amplifier 164. The tuning may include adjusting and matching of resistive and reactive components for optimum performance.

In this manner, using the tuning matching network blocks 192, 194 to match impedance of each source to load (e.g., antenna 156 to LNA 166 and/or PA 164 to antenna 156) may allow for isolation while optimizing low insertion loss. For example, the reconfigurable electrical balance may reduce insertion loss to 0.5 dB in TDD mode via the switches as previously described, and the matching network blocks 192, 194 may further lower insertion loss to 0.1 dB in TDD mode (e.g., TDD TX and TDD RX modes).

Figure 11:
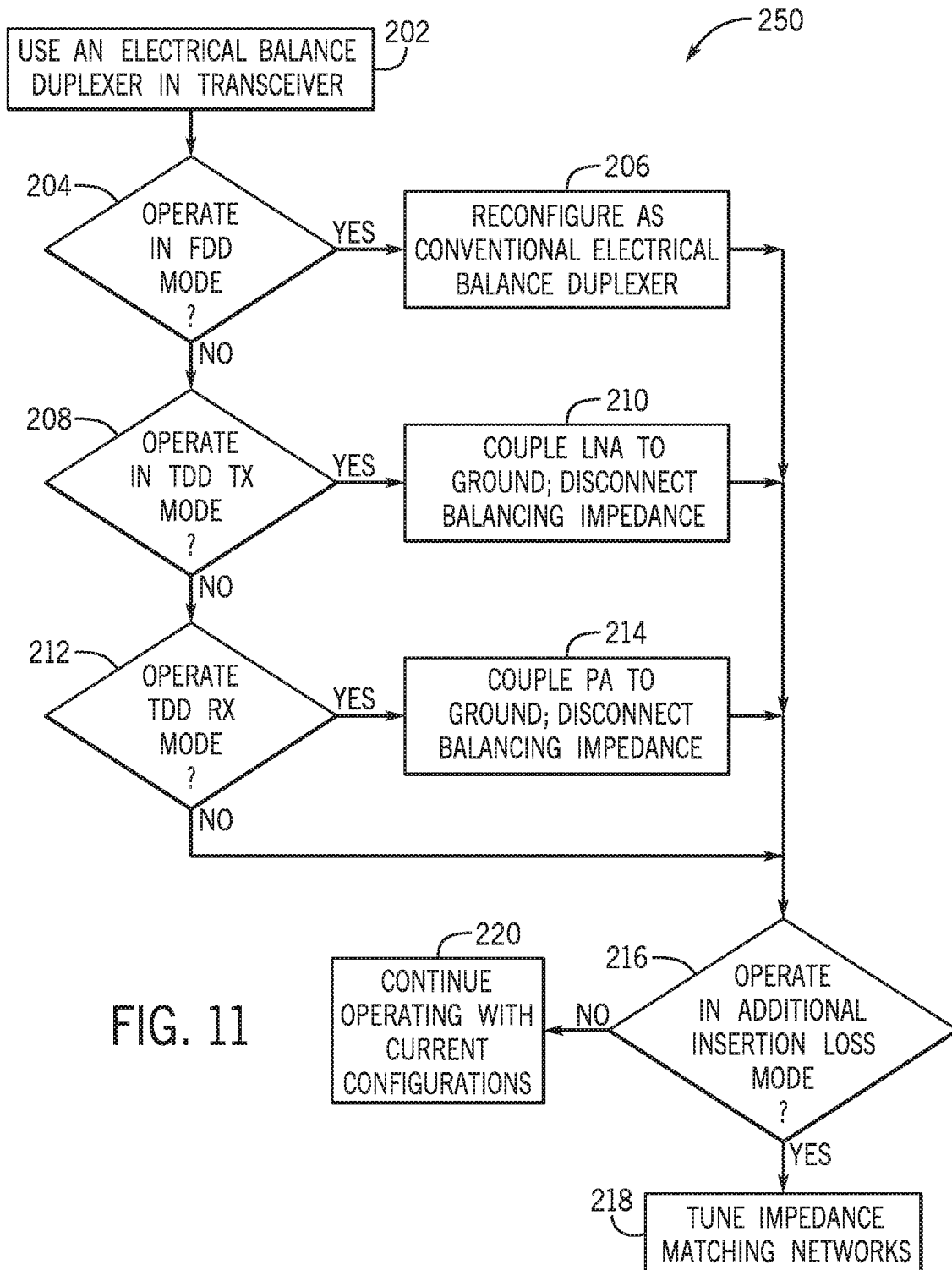
FIG. 11 is a flow diagram of the process of reconfiguring the electrical balance duplexer of FIG. 9 to operate in either FDD or TDD mode, in accordance with an embodiment.

Flow diagram FIG. 11 illustrates the process 250 for a machine-executable algorithm that may reconfigure the electrical balance duplexer 150 of FIG. 9 to operate in either TDD or FDD mode. The electronic device 10 may use (block 202) an electrical balance duplexer in its transceiver. In other words, the reconfigurable electrical balance duplexer 150 of FIG. 9 may be positioned within the transceiver of an electronic device.

A machine-executable algorithm of the device may determine (decision block 204) whether the device should operate in FDD mode. For example, the algorithm may poll a communicating device for compatible communication modes and determine that the communicating device uses FDD. If FDD is the appropriate mode of communication, then the electrical balance duplexer may be reconfigured (block 206) to operate using the switch configurations for the FDD mode, as described above with regard to FIG. 10. The FDD mode may allow for concurrent transmission and reception of signals on different frequency bands.

On the other hand, if FDD is determined not to be the appropriate mode for communication, then the electrical balance duplexer may be reconfigured using the same circuitry to operate in either TDD TX or TDD RX mode. The machine-executable algorithm of the device may determine (decision block 208) whether the device should operate in TDD TX mode. For example the device may determine timing intervals for transmission and reception with communicating devices. When the TDD TX mode is appropriate, the electrical balance duplexer may be reconfigured (block 210) to couple the low noise amplifier 166 to ground and disconnect the balancing impedance 170, thereby removing unused paths for the power amplifier 164 for less insertion loss of transmitted signals. For example, the switches of the reconfigurable electrical balance duplexer 150 of FIG. 9 may be adjusted based upon the TDD TX mode switch settings of FIG. 10.

However, if the TDD TX mode is not the appropriate mode of communication, the machine-executable algorithm of the device may determine (decision block 212) if the device should operate in TDD RX mode for communication. If the TDD RX mode is appropriate, the electrical balance duplexer may be reconfigured (block 214) to couple the power amplifier 164 to ground 188 and disconnect the balancing impedance 170, thereby removing unused paths for low noise amplifier 166 for less insertion loss of received signals. For example, the switches of the reconfigurable electrical balance duplexer 150 of FIG. 9 may be adjusted based upon the TDD RX mode switch settings of FIG. 10.

Once the algorithm sets the mode as FDD, TDD TX, or TDD RX for the reconfigurable electrical balance duplexer, the algorithm may further determine (decision block 216) whether the device should operate in an additional insertion loss mode utilizing tunable matching network blocks. For example, the algorithm may receive a feedback of measured insertion loss, such as by a power detector, and determine whether additional insertion loss mitigation should occur.

If the algorithm determines that the additional insertion loss mode should be implemented, then the tunable matching network blocks may be adjusted to tune (block 218) the impedance between components of the electrical balance duplexer circuit, such as the impedance of the source (e.g., from antenna 156 or PA 164) to the impedance of the load (e.g., to LNA 166 or antenna 156), allowing for the maximum amount of power transferred from the source to the load for a signal. The matching network blocks 192, 194 may be tuned to the varying target impedance based on the antenna impedance 168. The source impedance for the low noise amplifier 166 may also be matched to the load impedance for the power amplifier 164. As previously mentioned, the tuning may include adjusting and matching of resistive and/or reactive components for optimum performance. If impedance matching is unnecessary, then the electrical balance duplexer may continue (block 220) operating with current configurations in FDD or TDD modes, without further adjustment of the matching networks.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. An electrical balance duplexer (EBD) configured to operate in either a frequency division duplex (FDD) mode or a time division duplexing (TDD) mode, the EBD comprising:
    a plurality of inductors;
    a transceiver comprising a receiver circuit and a transmitter circuit, the receiver circuit comprising a low noise amplifier and the transmitter circuit comprising a power amplifier;

an antenna;
a first switch on a transmission path disposed between the power amplifier and the antenna to couple the power amplifier to the antenna;
a second switch on a receiver path disposed between the low noise amplifier and the antenna; and
a third switch disposed between the antenna and a balancing impedance;
the EBD configured to:
receive communication signals at the receiver circuit, as received communication signals, and transmit communication signals at the transmitter circuit of the transceiver, as transmitted communication signals, in duplex on the antenna;
isolate the receiver circuit and the transmitter circuit via the plurality of inductors;
amplify the received communication signals from the antenna via the low noise amplifier;
amplify the transmitted communication signals to the antenna via the power amplifier;
operate in the FDD mode by opening the first switch to couple the power amplifier to the antenna, opening the second switch to couple the low noise amplifier to the antenna, and closing the third switch to couple the balancing impedance to the antenna; and
in the FDD mode, isolating the received communication signals from the transmitted communication signals.

2. The EBD of claim 1, wherein the first switch is configured to couple the power amplifier to the antenna, the second switch is configured to decouple the low noise amplifier from the antenna, and the third switch is configured to decouple the balancing impedance from the antenna when transmitting signals in the TDD mode.

3. The EBD of claim 1, wherein the first switch is configured to decouple the power amplifier from the antenna, the second switch is configured to couple the low noise amplifier to the antenna, and the third switch is configured to decouple the balancing impedance from the antenna when receiving signals in the TDD mode.

4. The EBD of claim 1, wherein the EBD is configured to convey signals to the antenna during a first time slot using a single frequency band and receive signals from the antenna during a second time slot different from the first time slot using the single frequency band.

5. The EBD of claim 1, comprising a hybrid transformer having the plurality of inductors.

6. The EBD of claim 5, wherein the first switch decouples the power amplifier from ground, the second switch decouples the low noise amplifier from ground, and the third switch couples the balancing impedance to the hybrid transformer when communicating signals in the FDD mode.

7. The EBD of claim 1, wherein the plurality of inductors comprises a first inductor and a second inductor coupled to the first switch.

8. The EBD of claim 1, wherein the plurality of inductors comprises an inductor coupled to the second switch.

9. The EBD of claim 1:
a first tunable matching network coupled between an input of the low noise amplifier and a hybrid transformer; and
a second tunable matching network coupled between an output of the power amplifier and the hybrid transformer.

10. The EBD of claim 9, wherein the first tunable matching network and the second tunable matching network are configured to match impedance of the low noise amplifier, the power amplifier, or both to the antenna.

11. The EBD of claim 10, wherein matching the impedance reduces insertion loss of reception signals and transmission signals to 0.1 dB in the TDD mode.

12. A method for operating an electronic device comprising a transceiver in either a frequency division duplexing (FDD) mode or a time division duplexing (TDD) mode using a reconfigurable electrical balance duplexer, the method comprising:
receiving communication signals at a receiver circuit of the transceiver, as received communication signals, and transmitting communication signals at a transmitter circuit of the transceiver, as transmitted communication signals, in duplex on an antenna of the reconfigurable electrical balance duplexer, the reconfigurable electrical balance duplexer configured to isolate the receiver circuit and the transmitter circuit via a plurality of inductors of the reconfigurable electrical balance duplexer;
amplifying the received communication signals from the antenna by a low noise amplifier;
amplifying the transmitted communication signals to the antenna by a power amplifier;
operating the electronic device in the FDD mode by opening a first switch on a transmission path disposed between the power amplifier and the antenna to couple the power amplifier to the antenna, opening a second switch on a receiver path disposed between the low noise amplifier and the antenna to couple the low noise amplifier to the antenna, and closing a third switch disposed between a balancing impedance and the antenna to couple the balancing impedance of the reconfigurable electrical balance duplexer to the antenna; and
in the FDD mode, isolating the received communication signals from the transmitted communication signals.

13. The method of claim 12, wherein reconfiguring the reconfigurable electrical balance duplexer to operate in the TDD mode and transmitting the communication signals comprises closing the second switch to couple the low noise amplifier to ground, opening the first switch to maintain connection between the antenna and the power amplifier, and opening the third switch to disconnect the antenna and the balancing impedance.

14. The method of claim 12, wherein reconfiguring the reconfigurable electrical balance duplexer to operate in the TDD mode and receiving communication signals comprises opening the second switch to maintain connection between the antenna and the low noise amplifier, closing the first switch to couple the power amplifier to ground, and opening the third switch to disconnect the antenna and the balancing impedance.

15. An electrical balance duplexer (EBD) configured to:
receive reception signals at a receiver circuit and transmit transmission signals at a transmitter circuit in duplex on an antenna of the electrical balance duplexer, the electrical balance duplexer configured to isolate the receiver circuit and the transmitter circuit via a plurality of inductors of the electrical balance duplexer;
amplify the reception signals from the antenna using a low noise amplifier;
amplify the transmission signals to the antenna using a power amplifier;
communicatively decouple the low noise amplifier from the electrical balance duplexer by closing a first switch on a receiver path disposed between the low noise amplifier and the electrical balance duplexer, communicatively couple the power amplifier to the electrical balance duplexer by opening a second switch on a transmission path disposed between the power amplifier and the antenna, and communicatively decouple the antenna from a balancing impedance of the electrical balance duplexer by opening a third switch disposed between the balancing impedance and the antenna in a time division duplexing (TDD) mode when transmitting the transmission signals; and communicatively decouple the power amplifier from the electrical balance duplexer by closing the second switch, communicatively couple the low noise amplifier to the electrical balance duplexer by opening the first switch, and communicatively decouple the antenna from the balancing impedance of the electrical balance duplexer by opening the third switch in the TDD mode when receiving the reception signals.

16. The EBD of claim 15, configured to couple, decouple, or a combination thereof, a plurality of switches of the electrical balance duplexer when communicating signals in the TDD mode or a frequency division duplexing (FDD) mode.

17. The method of claim 12, comprising operating the electronic device in the TDD mode by
communicatively decoupling the low noise amplifier from the reconfigurable electrical balance duplexer when transmitting the communication signals, or
communicatively decoupling the power amplifier from the reconfigurable electrical balance duplexer when receiving the communication signals.

18. The EBD of claim 15, wherein the EBD is configured to isolate the reception signals from the transmission signals in a frequency division duplexing (FDD) mode.

19. The EBD of claim 15, wherein the EBD is configured to receive the reception signals during a first time slot and transmit the transmission signals during a second time slot in the TDD mode, the reception signals and the transmission signals having frequencies in a same frequency band.

20. The EBD of claim 16, wherein the EBD is configured to receive the reception signals and transmit the transmission signals concurrently in the FDD mode, the reception signals and the transmission signals having frequencies in different frequency bands.

* * * * *